United States Patent
Sung

(10) Patent No.: US 6,353,568 B1
(45) Date of Patent: Mar. 5, 2002

(54) DUAL THRESHOLD VOLTAGE SENSE AMPLIFIER

(75) Inventor: Roberto Sung, Sunnyvale, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/752,357

(22) Filed: Dec. 29, 2000

(51) Int. Cl.[7] ................................. G11C 7/00
(52) U.S. Cl. ................ 365/207; 365/205; 327/57
(58) Field of Search ........................ 365/207, 205, 365/208; 327/57, 52, 55

(56) References Cited

U.S. PATENT DOCUMENTS

| | | | | |
|---|---|---|---|---|
| 4,169,233 A | * | 9/1979 | Haraseti | 327/57 |
| 5,546,026 A | * | 8/1996 | Lin et al. | 327/52 |
| 5,675,535 A | * | 10/1997 | JinBo | 365/205 |
| 5,859,806 A | * | 1/1999 | Wada | 365/207 |

* cited by examiner

Primary Examiner—Tan T. Nguyen
(74) Attorney, Agent, or Firm—Suiter & Associates PC

(57) ABSTRACT

A dual threshold voltage sense amplifier that is capable of separating the rise time threshold from the fall time threshold, creating a dual sensing threshold voltage. In one embodiment of the invention, the dual threshold voltage sense amplifier is capable of providing a lower threshold for the rise time and a higher threshold for the fall time, thereby reducing the fall time and improving the read speed in asynchronous static memory without substantially increasing the core cell dimension or the overall design size.

25 Claims, 5 Drawing Sheets

DUAL THRESHOLD VOLTAGE SENSE AMPLIFIER

FIELD OF THE INVENTION

The present invention generally relates to the field of asynchronous static memory and more particularly to a dual threshold voltage sense amplifier for improving the read speed in asynchronous static memory without substantially increasing the core cell dimension or the overall design size.

BACKGROUND OF THE INVENTION

In existing asynchronous static memory designs, the prevalent architecture employs a single NMOS (N-channel Metal Oxide Semiconductor) transistor to connect each core memory cell to the read bit line as shown in FIG. 1. This approach seeks to minimize the core cell dimension by using one transistor and one read word line. However, due to the finite threshold voltage of the NMOS transistor, the core cell, by itself, cannot drive the read bit line to full Vdd. Instead, a pair of inverters must be used as a sticky latch to pull the read bit line rail to rail. Furthermore, the rise time of the bit line waveform is typically slower than the fall time because the NMOS driving strength reduces as the bit line voltage rises near the threshold voltage.

Typical sense amplifiers utilize a simple inverter gate with its logic threshold set to a level that yields equal rise and fall times. These rise and fall times can be very large in the conventional single threshold design under certain conditions, for example, when the applied Vdd approaches the NMOS threshold voltage. The two separate threshold level approach allows for independent adjustment of the rise and fall times. However, any improvement in the rise time using the two separate threshold level approach is offset by a larger fall time. This is because the sense amplilier's logic threshold level is required to be low enough that it can still trigger correctly even at the lowest applied Vdd, causing the fall time to stretch much longer than necessary to detect a logic zero.

Consequently, it is desirable to provide a dual threshold voltage sense amplifier that is capable of separating the rise time threshold from the fall time threshold, creating a dual sensing threshold voltage. In particular, it is desirable to provide a dual threshold voltage sense amplifier capable of providing a lower threshold for the rise time and a higher threshold for the fall time, thereby reducing the fall time and improving the read speed in asynchronous static memory without substantially increasing the core cell dimension or the overall design size.

SUMMARY OF THE INVENTION

Accordingly, the present invention is directed to a dual threshold voltage sense amplifier that is capable of separating the rise time threshold from the fall time threshold, creating a dual sensing threshold voltage. In one embodiment of the invention, the dual threshold voltage sense amplifier is capable of providing a lower threshold for the rise time and a higher threshold for the fall time, thereby reducing the fall time and improving the read speed in asynchronous static memory without substantially increasing the core cell dimension or the overall design size.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiment of the invention, an example of which is illustrated in the accompanying drawings.

Figure 2:
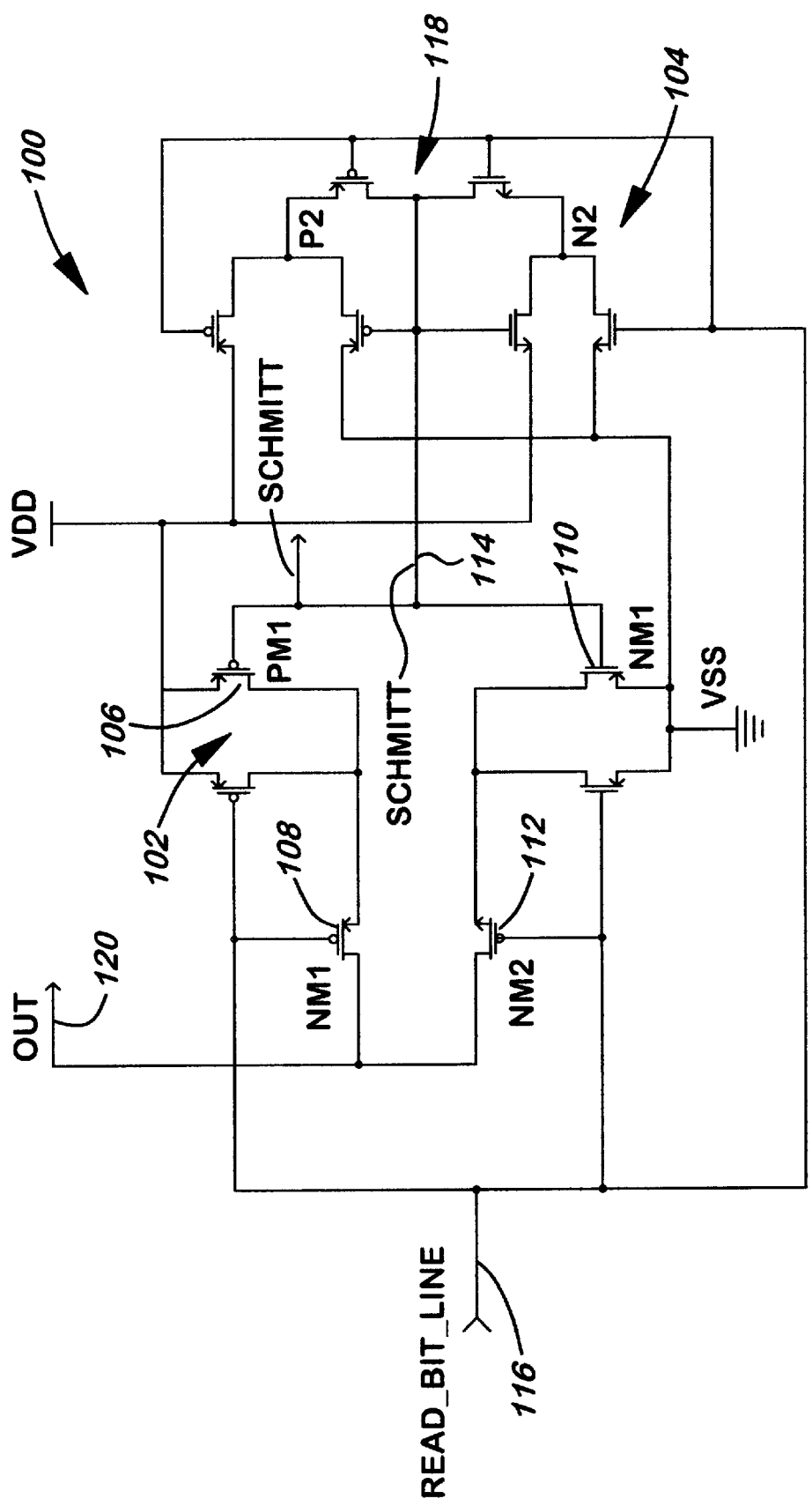
FIG. 2 is a circuit diagram illustrating a dual threshold voltage sense amplifier in accordance with an exemplary embodiment of the present invention.

Referring now to FIG. 2, a dual threshold voltage sense amplifier in accordance with an exemplary embodiment of the present invention is described. The dual threshold voltage sense amplifier 100 is capable of separating the rise time threshold from the fall time threshold, creating a dual sensing threshold voltage. In one embodiment of the invention, the dual threshold voltage sense amplifier 100 is capable of providing a lower threshold for the rise time and a higher threshold for the fall time, thereby reducing the fall time and improving the read speed in asynchronous static memory without substantially increasing the core cell dimension or the overall design size. In this manner, the dual threshold voltage sense amplifier 100 functions in a manner that is somewhat analogous (although opposite) to a Schmitt trigger.

Figure 3:
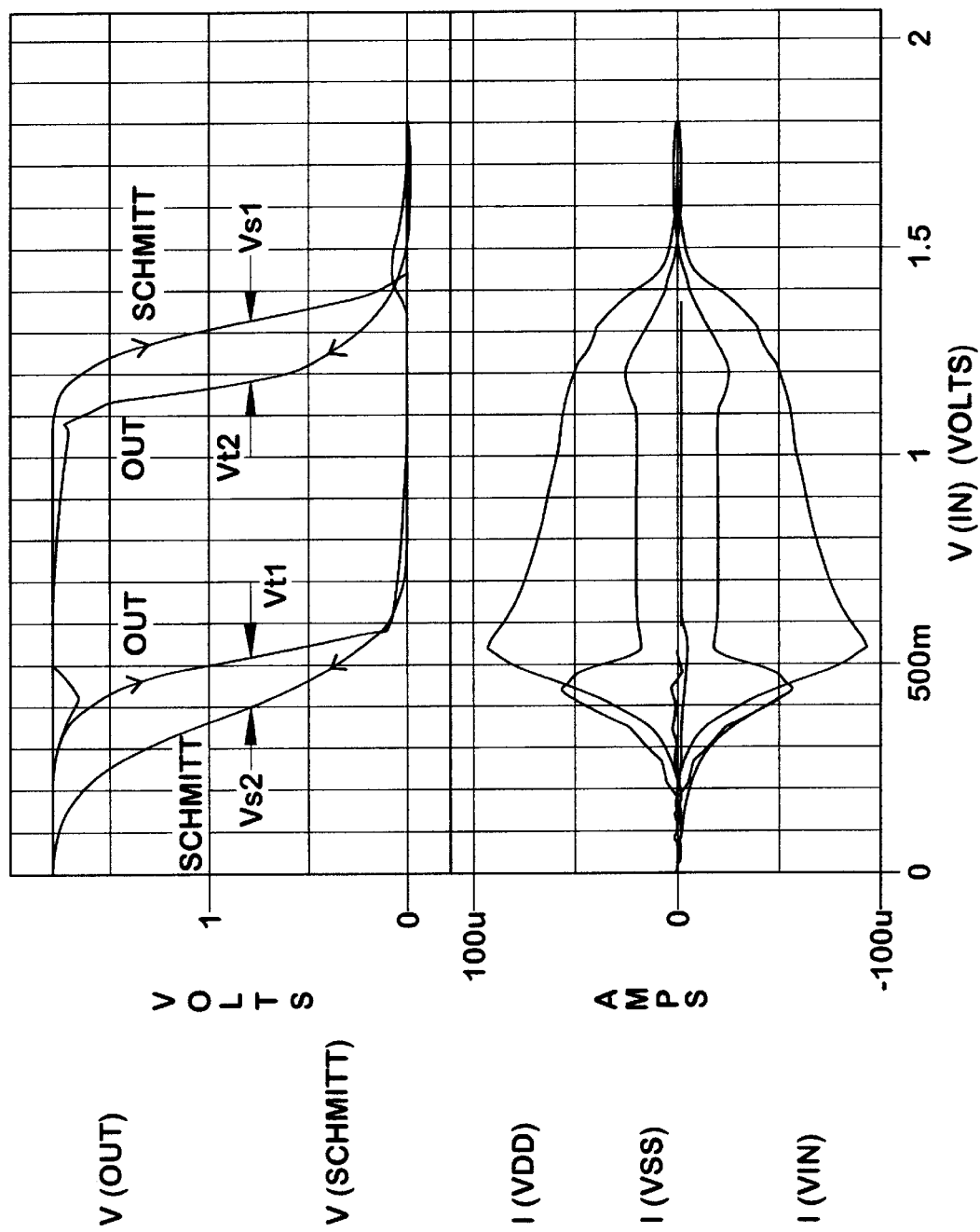
FIG. 3 is a graph illustrating the current (I) and voltage (V) characteristics of the dual threshold voltage sense amplifier shown in FIG. 2.

As shown in FIG. 2, the dual threshold voltage sense amplifier 100 may be comprised of two inverter stages: a first inverter stage 102 suitable for pulling the read bit line high or low upon reaching a threshold voltage level, and a second inverter stage 104 suitable for providing a signal to the first inverter stage for controlling the threshold voltage level of the first inverter stage. In such an embodiment, P-channel transistors "PM1" 106 and "PM2" 108 the first inverter stage 102 are in series, as are N-channel transistors "NM1" 110 and "NM2" 112. The threshold voltage of the first inverter stage 102 is dependent on the value of the signal "SCHMITT" 114, If the signal "SCHMITT" 114 is high, transistor "NM1" 110 is on and threshold voltage "Vt1" is low. Further, in exemplary embodiments, when the signal "SCHMITT" 114 is high, the threshold voltage "Vt1" is substantially lower than voltage "Vdd". On the other hand, when the signal "SCHMITT" 114 is low, transistor "PM1" is on and the threshold voltage becomes "Vt2" which is high. Exemplary current (I) and voltage (V) characteristics of the dual threshold voltage sense amplifier 100 shown in FIG. 2 are illustrated in FIG. 3. Preferably, the signal "SCHMITT" 114 controls the threshold level and is a delayed signal of the read bit line "READ_BIT_LINE" 116 of the asynchronous static memory circuit. This delay is provided by the Schmitt trigger 118 of the second inverter stage 104. In this manner, the Schmitt trigger 118 improves the overall stability of the output signal "OUT" 120 when the input ramp time is too long.

As the dual threshold voltage sense amplifier 100 allows the ramp up and ramp down threshold levels to be individually tuned, the rise and fall times can be independently optimized for improved speed while still meeting a low "Vdd" requirement. Thus, in embodiments of the invention, the dual threshold voltage sense amplifier 100 may be used for controlling the tri-state feedback of an asynchronous static memory.

Figure 4:
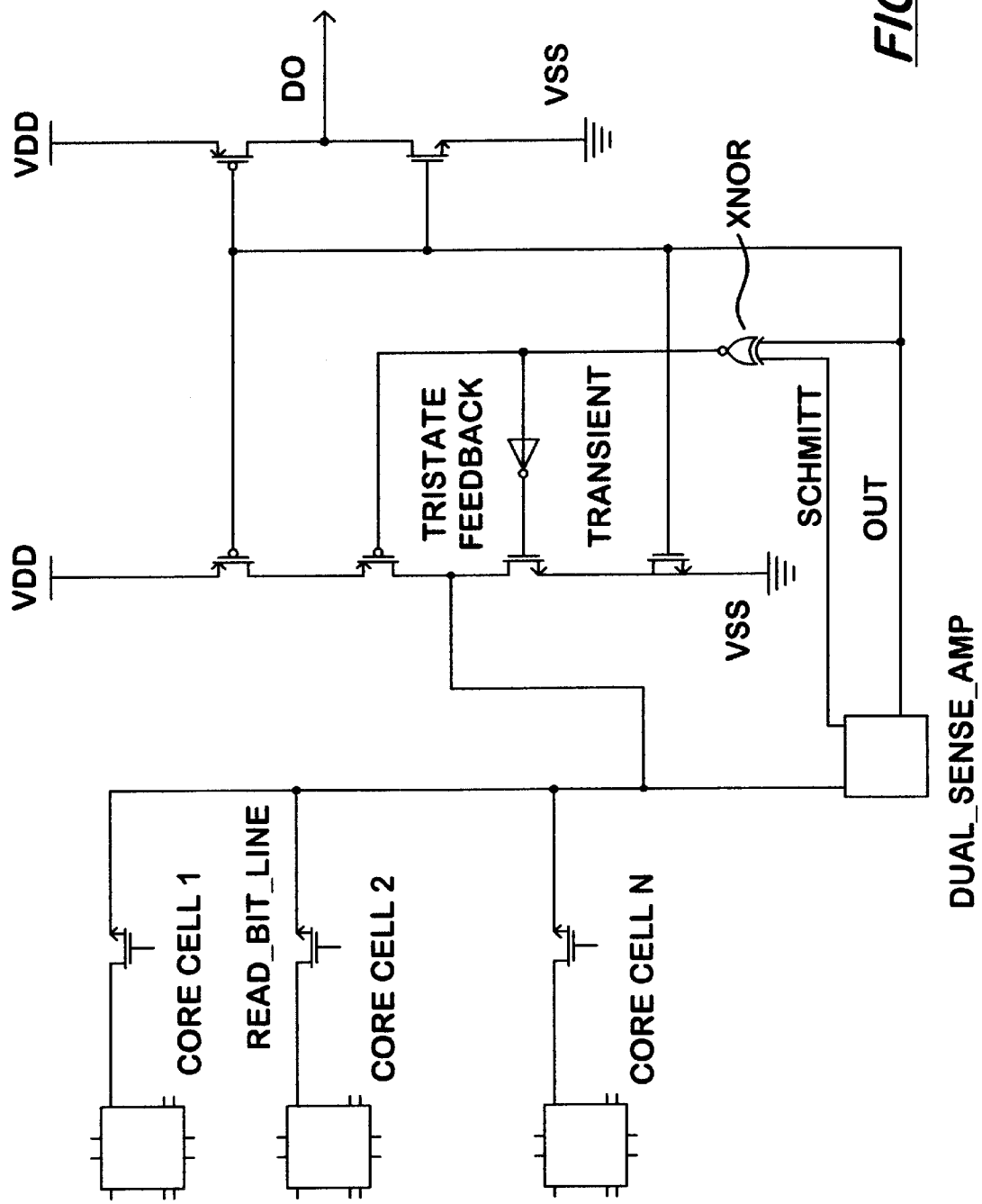
FIG. 4 is a circuit diagram illustrating a sense amplifier for controlling the tri-state feedback of an asynchronous static memory in accordance with an exemplary embodiment of the present invention.

Referring now to FIG. 4, use of a dual threshold voltage sense amplifier for controlling the tri-state feedback of an asynchronous static memory circuit in accordance with an exemplary embodiment of the present invention is described. Preferably, the feedback gate is active only when the dual threshold voltage sense amplifier outputs "SCHMITT" and "OUT" are opposite of each other, which happens only when the voltage of the input (e.g., "READ_BIT_LINE") is between "Vt1" and "Vs1" and/or between "Vt2" and "Vs2". In this manner, the present invention speeds up the "READ_BIT_LINE" ramp time after the "OUT" signal has been triggered, but before the next read cycle starts. Thus, unlike prior asynchronous static memory circuits, the tri-state feedback will not fight against the core cell in the beginning of the read cycle.

Figure 1:
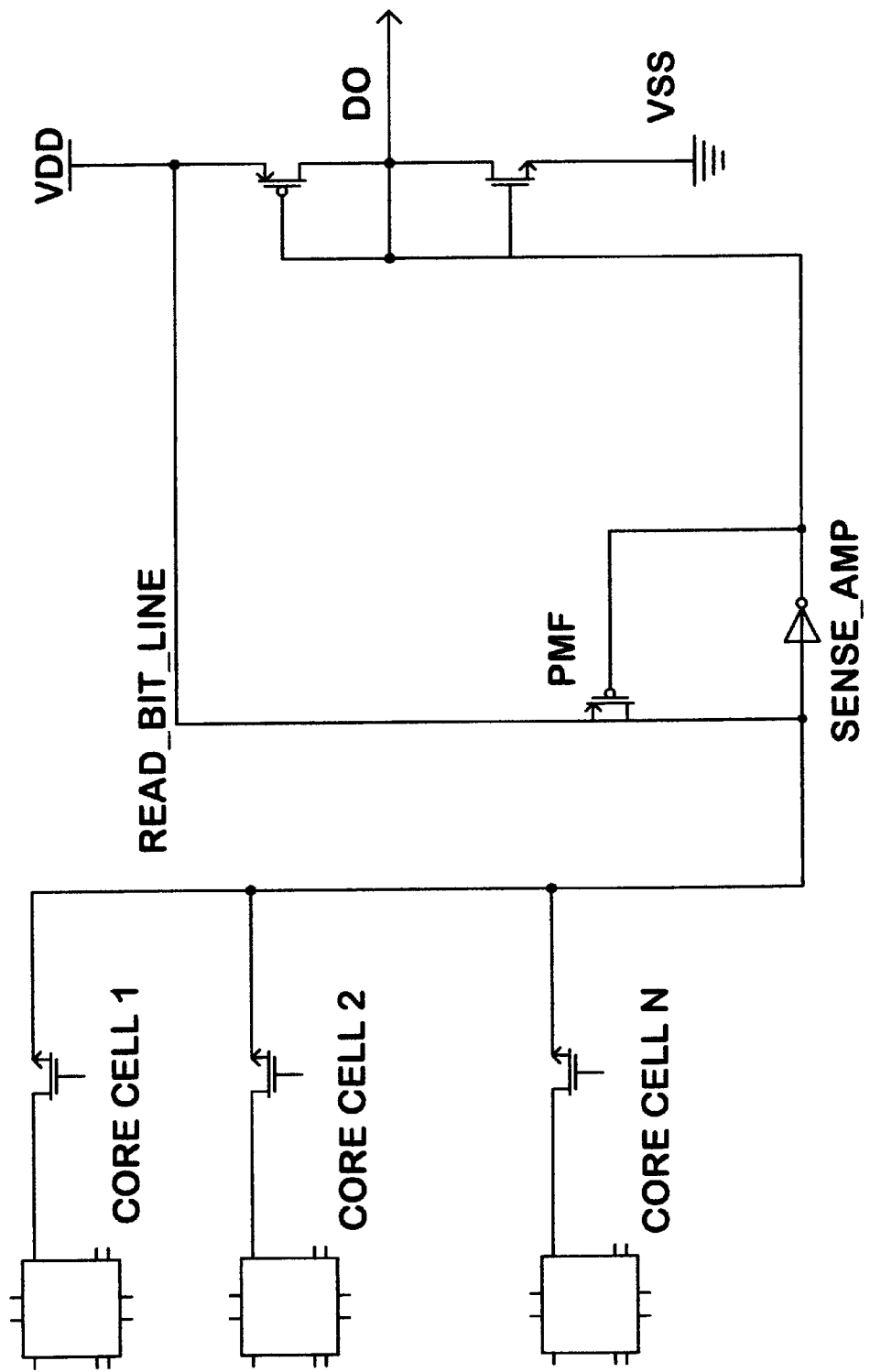
FIG. 1 is a circuit diagram illustrating an asynchronous static memory design employing a single NMOS transistor to connect each core cell to the read bit line.
Figure 5:
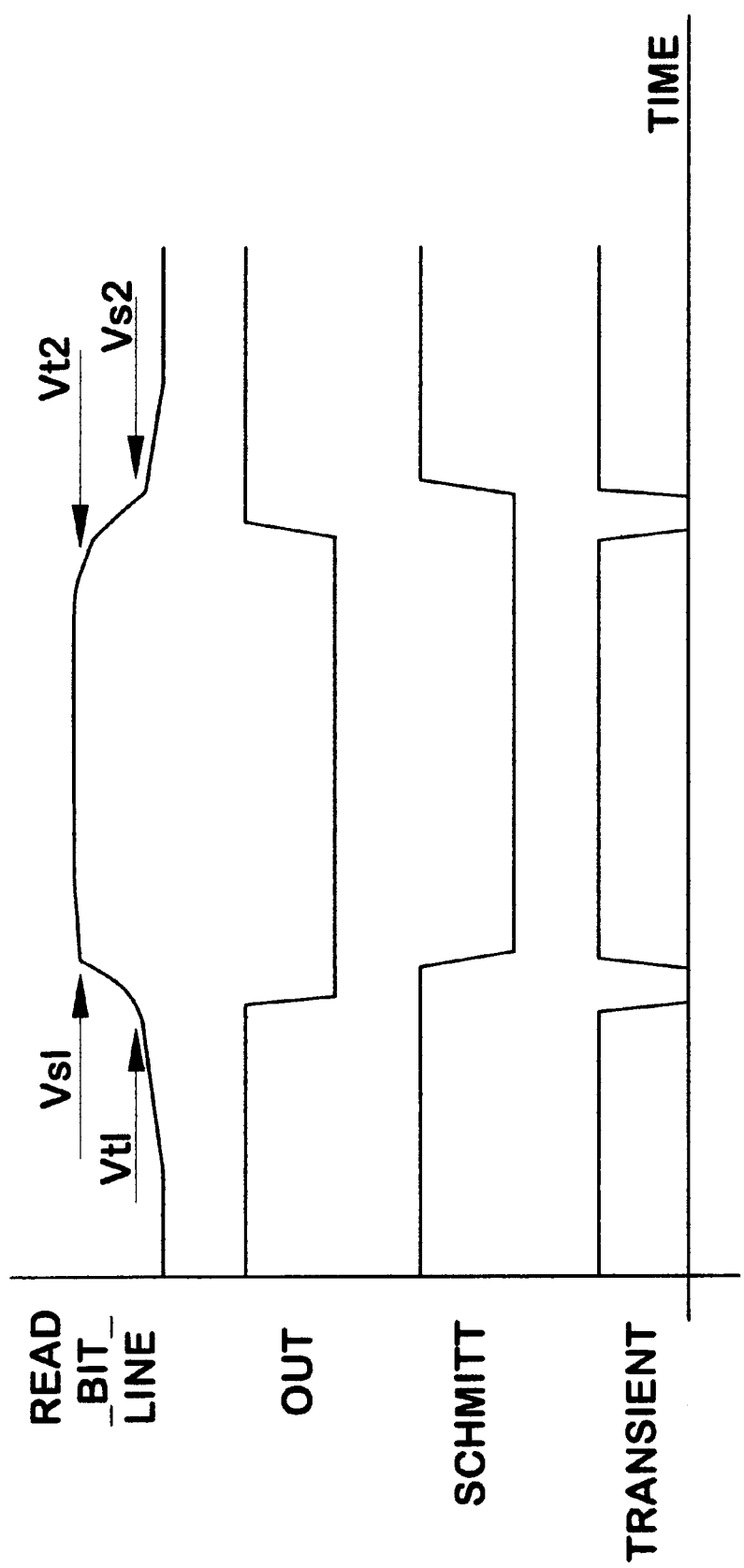
FIG. 5 is a graph illustrating a typical waveform for the circuit shown in FIG. 4.

Referring now to FIG. 5, a typical waveform is shown where "Vt1" indicates the low threshold voltage of the dual threshold voltage sense amplifier of the present invention and "Vt2" indicates the high threshold voltage, while "Vs1" and "Vs2" are the threshold voltages of the Schmitt Trigger. As shown, the output signal, "OUT", reaches the desired voltage in substantially less time than it takes for the core cell to drive the "READ_BIT_LINE" to "Vdd/2" if the core cell had to fight against the PMOS ((P-channel Metal Oxide Semiconductor) feedback transistor "PMF" (FIG. 1). In this configuration, the rise cycle effectively ends after the signal "SCHMITT" falls which is when the next cycle can start.

In exemplary embodiments of the present invention, the dual threshold sense amplifier may be implemented utilizing a charge pump to alter the bulk voltage of a simple inverter to take advantage of the gate threshold voltage dependence on back bias. However the design rules for devices with substrate not tied to the source may cause such implementations to occupy substantially more chip area and may also require changes to the DRC checker.

It is believed that the dual threshold sense amplifier of the present invention and many of its attendant advantages will be understood by the forgoing description, and it will be apparent that various changes may be made in the form, construction and arrangement of the components thereof without departing from the scope and spirit of the invention or without sacrificing all of its material advantages, the form herein before described being merely an explanatory embodiment thereof. It is the intention of the following claims to encompass and include such changes.

What is claimed is:

1. A dual threshold voltage sense amplifier suitable for controlling voltage of a read bit line of a core cell in an asynchronous static memory, comprising:
   a first inverter stage suitable for pulling the read bit line high or low upon reaching a threshold voltage level; and
   a second inverter stage suitable for providing a signal to said first inverter stage for controlling the threshold voltage level of the first inverter stage;
   wherein said signal controls the threshold voltage of said first inverter stage so that said first inverter stage has a first threshold voltage for a rise time of the read bit line and a second threshold voltage for a fall time of the read bit line, the second threshold voltage being higher than the first threshold voltage.

2. The dual threshold voltage sense amplifier of claim 1, wherein said second inverter stage further comprises a Schmitt trigger for controlling the signal.

3. The dual threshold voltage sense amplifier of claim 2, wherein said Schmitt trigger controls said signal to be a delayed signal of the read bit line.

4. The dual threshold voltage sense amplifier of claim 1, wherein said first inverter stage comprises a first set of transistors arranged in series and a second set of transistors in series.

5. The dual threshold voltage sense amplifier of claim 4, wherein said first set of transistors comprise P-channel transistors and said second set of transistors comprise N-channel transistors.

6. The dual threshold voltage sense amplifier of claim 1, wherein when said signal is high, said first threshold voltage is provided.

7. The dual threshold voltage sense amplifier of claim 1, wherein when said signal is low, said second threshold voltage is provided.

8. The dual threshold voltage sense amplifier of claim 1, wherein said first threshold voltage is lower than Vdd/2.

9. A dual threshold voltage sense amplifier suitable for controlling voltage of a read bit line of a core memory cell in an asynchronous static memory, comprising:
   first means for pulling the read bit line high or low upon reaching a threshold voltage level; and
   second means suitable for providing a signal to said first means for controlling the threshold voltage level;
   wherein said signal controls the threshold voltage of said first means so that said first inverter has a first threshold voltage for a rise time of the read bit line and a second threshold voltage for a fall time of the read bit line, the second threshold voltage being higher than the first threshold voltage.

10. The dual threshold voltage sense amplifier of claim 9, wherein said second means further comprises a Schmitt trigger for controlling the signal.

11. The dual threshold voltage sense amplifier of claim 10, wherein said Schmitt trigger controls said signal to be a delayed signal of the read bit line.

12. The dual threshold voltage sense amplifier of claim 9, wherein said first means comprises a first set of transistors arranged in series and a second set of transistors in series.

13. The dual threshold voltage sense amplifier of claim 12, wherein said first set of transistors comprise P-channel transistors and said second set of transistors comprise N-channel transistors.

14. The dual threshold voltage sense amplifier of claim 9, wherein when said signal is high, said first threshold voltage is provided.

15. The dual threshold voltage sense amplifier of claim 9, wherein when said signal is low, said second threshold voltage is provided.

16. The dual threshold voltage sense amplifier of claim 9, wherein said first threshold voltage is lower than Vdd/2.

17. An asynchronous static memory, comprising:
   at least one core memory cell;

a dual threshold voltage sense amplifier suitable for controlling voltage of a read bit line of said core memory cell, said dual threshold voltage sense amplifier further comprising:
- a first inverter stage suitable for pulling the read bit line high or low upon reaching a threshold voltage level; and
- a second inverter stage suitable for providing a signal to said first inverter stage for controlling the threshold voltage level of the first inverter stage;
- wherein said signal controls the threshold voltage of said first inverter stage so that said first inverter stage has a first threshold voltage for a rise time of the read bit line and a second threshold voltage for a fall time of the read bit line, the second threshold voltage being higher than the first threshold voltage.

18. The asynchronous static memory of claim 17, wherein said second inverter stage further comprises a Schmitt trigger for controlling the signal.

19. The asynchronous static memory of claim 18, wherein said Schmitt trigger controls said signal to be a delayed signal of the read bit line.

20. The asynchronous static memory of claim 17, wherein said first inverter stage comprises a first set of transistors arranged in series and a second set of transistors in series.

21. The asynchronous static memory of claim 20, wherein said first set of transistors comprise P-channel transistors and said second set of transistors comprise N-channel transistors.

22. The asynchronous static memory of claim 17, wherein when said signal is high, said first threshold voltage is provided.

23. The asynchronous static memory of claim 17, wherein when said signal is low, said second threshold voltage is provided.

24. The asynchronous static memory of claim 17, wherein said first threshold voltage is lower than Vdd/2.

25. The asynchronous static memory of claim 17, further comprising a feedback gate, wherein said dual threshold voltage sense amplifier is used for controlling tri-state feedback of the feedback gate.

* * * * *